United States Patent
Wu et al.

(10) Patent No.: US 6,316,352 B1
(45) Date of Patent: Nov. 13, 2001

(54) METHOD OF FABRICATING A BOTTOM ELECTRODE

(75) Inventors: King-Lung Wu, Tainan Hsien; Tzung-Han Lee, Taipei, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/704,189

(22) Filed: Nov. 1, 2000

(30) Foreign Application Priority Data

Oct. 24, 2000 (TW) .................................... 89122368

(51) Int. Cl.[7] .............................................. H01L 21/4763
(52) U.S. Cl. ................................................ 438/639
(58) Field of Search ............................ 438/639, 647, 438/680, 253, 258, 396

(56) References Cited

U.S. PATENT DOCUMENTS 5,966,610 * 10/1999 Wang et al. ......................... 438/396
6,054,394 * 4/2000 Wang ................................... 438/753

* cited by examiner

Primary Examiner—David Nelms
Assistant Examiner—Quoc Hoang
(74) Attorney, Agent, or Firm—Thomas, Kayden, Horstemeyer & Risley

(57) ABSTRACT

A method of fabricating a bottom electrode is described. A substrate having a first conductive layer therein is provided. A first dielectric layer is formed over the substrate. A plurality bit lines is formed over the first dielectric layer. A conformal liner layer is formed over the first dielectric layer to cover the plurality bit lines. A second dielectric layer is formed over the conformal liner layer. An opening is formed in the second dielectric layer. The opening exposes a portion of the conformal liner layer between the bit lines and the conformal liner layer on portions of the bit lines. A conductive spacer is formed on a sidewall of the opening to expose a portion of the conformal liner layer between the bit lines. The exposed portion of the conformal liner layer between the bit lines is removed. The first dielectric layer exposed by the conductive spacer and the second dielectric layer are removed to form a node contact opening in the first dielectric layer. The node contact opening exposes the conductive layer. A second conductive layer is formed to fill the node contact opening.

20 Claims, 4 Drawing Sheets

METHOD OF FABRICATING A BOTTOM ELECTRODE

CROSS-REFERENCE TO RELATED APPLICATION

This application claims the priority benefit of Taiwan application serial no. 89122368, filed Oct. 24, 2000.

BACKGROUND OF THE INVENTION

1. Field of the Invention

The present invention relates to a semiconductor fabrication method. More particularly, the present invention relates to a method of fabricating a bottom electrode.

2. Description of the Related Art

As the integration of the semiconductor devices increases and the linewidth thereof decreases, it becomes desirable to form more semiconductor devices in a very limited area. Due to limitations imposed by the fabrication process, it is difficult to achieve a highly integrated circuit. In addition, because difficulties exist in forming a highly integrated device, it is hard to ensure the reliability of the device. Therefore, how to fabricate highly integrated semiconductor devices has became the main topic of the recent research on semiconductor fabrication at the 0.13 micron level.

FIG. 1 is a schematic, cross-sectional view illustrating a conventional method of forming a bit line and a bottom electrode.

A metal oxide semiconductor (MOS) is formed on the substrate 100. The MOS includes a gate 102 on the substrate 100, a spacer 104 on the sidewall of the gate 102 and the source/drain region 106 in the substrate 100 beside the gate 102. A dielectric layer 108 is formed over the substrate 100 to cover the MOS. A bit line 110 is formed through the dielectric layer 108 to electrically couple with the source/drain region 106. A dielectric layer 112 is formed over the substrate 100 to cover the bit line 110. A bottom electrode 114 is formed through the dielectric layers 108 and 112 to electrically couple with the source/drain region 106.

In the conventional method, devices, such as bit line 110 and the bottom electrode 114 are separated from each other. Consequently, the integration of the semiconductor circuit cannot be effectively increased. Thus, there is a need to further increase the integration of semiconductor devices.

In addition, due to the fabrication limitation for forming semiconductor devices in a limited area, box-shaped capacitors are usually formed. However, the conventional box-shaped capacitor cannot provide sufficient capacitance. Thus, the capacitance of the conventional capacitor is limited.

SUMMARY OF THE INVENTION

The invention provides a method of fabricating a bottom electrode. A substrate having a first conductive layer therein is provided. A first dielectric layer is formed over the substrate. A plurality bit lines is formed over the first dielectric layer. A conformal liner layer is formed over the first dielectric layer to cover the plurality bit lines. A second dielectric layer is formed over the conformal liner layer. An opening is formed in the second dielectric layer. The opening exposes a portion of the conformal liner layer between the bit lines and the conformal liner layer on portions of the bit lines. A conductive spacer is formed on a sidewall of the opening to expose a portion of the conformal liner layer between the bit lines. The exposed portion of the conformal liner layer between the bit lines is removed. The first dielectric layer exposed by the conductive spacer and the second dielectric layer are removed. A node contact opening is formed in the first dielectric layer to expose the conductive layer. A second conductive layer is formed to fill the node contact opening.

In contrast with the conventional method, which has devices far way from each other, the devices of the present invention are next to each other. In addition, since the liner layer is used to isolate the bit lines from the bottom electrode, the reliability of the devices is enhanced. Furthermore, in comparison with the box-shaped bottom electrode formed by the conventional method, the bottom electrode of the present invention has an increased surface area.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
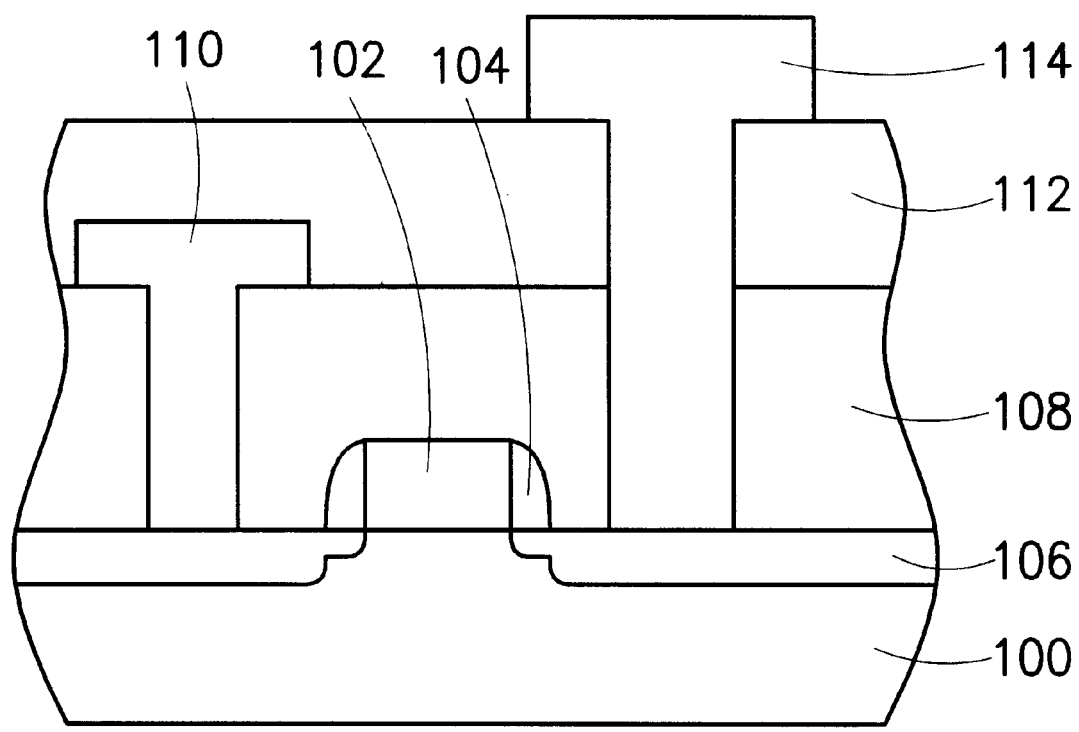
FIG. 1 is a schematic, cross-sectional view illustrating a conventional method of forming a bottom electrode and a bit line.

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views illustrating a method of fabricating a bottom electrode according to one preferred embodiment of the invention.

Figure 2A:
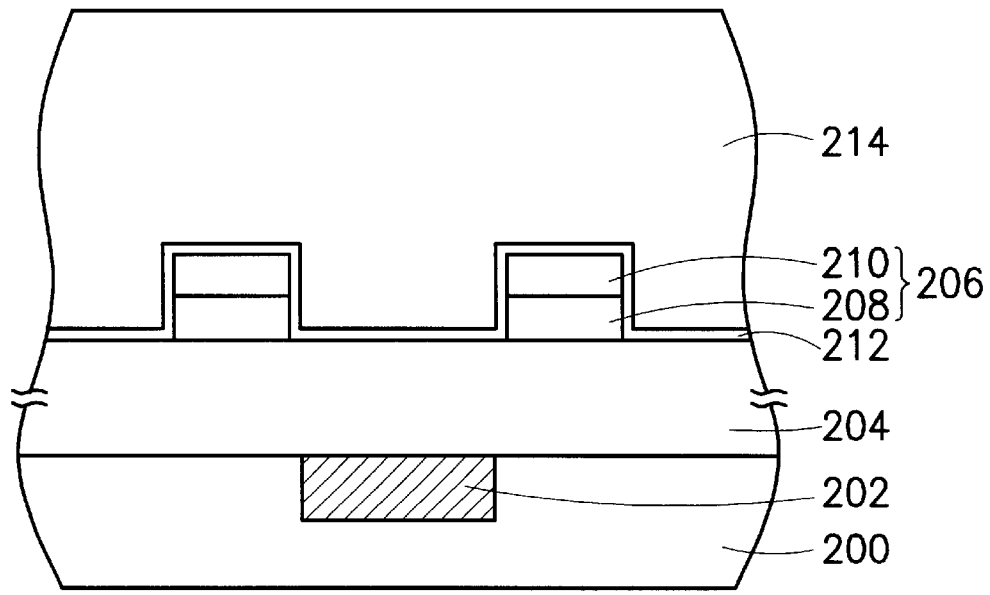
FIGS. 2A through 2F are schematic, cross-sectional views illustrating a method of fabricating a bottom electrode according to one preferred embodiment of the invention.

Referring to FIG. 2A, a substrate 200 having a conductive layer 202 therein is provided. A dielectric layer 204 is formed over the substrate 200 by, for example, chemical vapor deposition. The dielectric layer 204 includes an oxide layer, a tetraethyl-ortho-silicate (TEOS) layer, a borophosphosilicate glass (BPSG) layer, or a phosphosilicate glass (PSG) layer. A plurality of bit lines 206 is formed on the dielectric layer 204. Each bit line 206 includes, for example, a polysilicon layer 208 and a tungsten silicide layer 210. A conformal liner layer 212 is formed over the dielectric layer 204 by, for example, plasma-enhanced chemical vapor deposition or deposition in a furnace. The conformal liner layer 212 preferably has a thickness of about 100 angstroms to 500 angstroms. A dielectric layer 214 is formed over the substrate 200 by, for example, chemical vapor deposition. The dielectric layer 214 preferably has a thickness of about 8000 angstroms to 10000 angstroms. The dielectric layer 214 includes an oxide layer, a tetra-ethyl-ortho-silicate (TEOS) layer, a borophosphosilicate glass (BPSG) layer, and a phosphosilicate glass (PSG) layer.

Figure 2B:
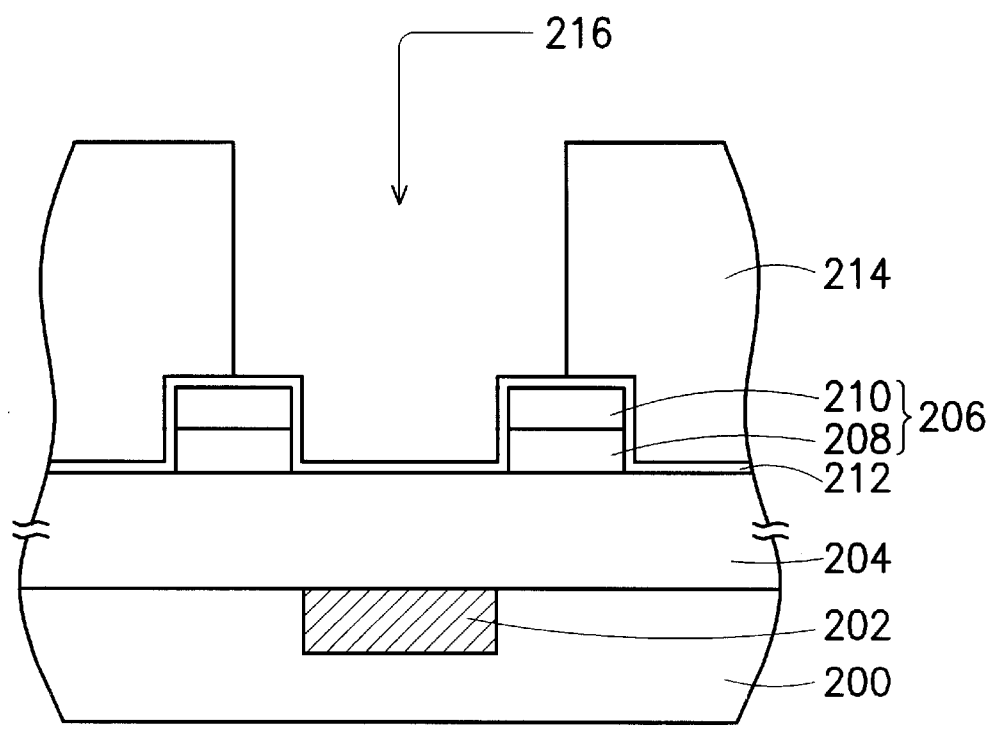

Referring to FIG. 2B, an opening 216 is formed in the dielectric layer 214. The opening 216 is slightly wider than the space between the bit lines 206 as shown in the figure. That is, the opening 216 exposes liner layer 212 between the bit lines 206 and the liner layer 212 on portions of the bit lines 206. The opening 216 in the dielectric layer 214 can be formed by, for example, a photolithographic and etching process. In the photolithographic and etching process, the etchant has a high etching selectivity between the dielectric layer 214 and the liner layer 212. That is, the etching rate of the dielectric layer 214 is higher than that of the liner layer 212. The liner layer 212 thus is used as an etching stop during the etching step. For example, in the case that the material of the dielectric layer 214 is oxide, the liner layer 212 is a silicon nitride layer.

Figure 2C:
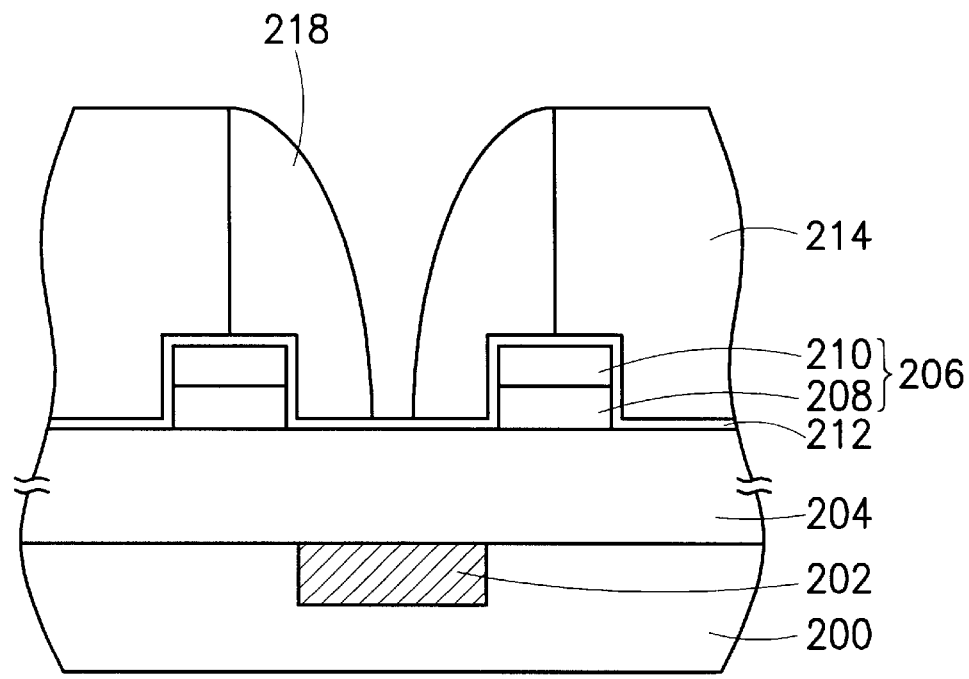

Referring to FIG. 2C, a conductive spacer 218 is formed on a sidewall of the opening 216. The conductive spacer 218 can be formed by, for example, forming a conductive layer (not shown) over the dielectric layer 214 followed by etching back the conductive layer. The conductive spacer 218 includes a polysilicon spacer. The conductive spacer 218 exposes a portion of the liner layer 212 between the bit lines 206. The exposed portion of the liner layer 212 between the bit lines 206 is aligned with the conductive layer 202.

Figure 2D:
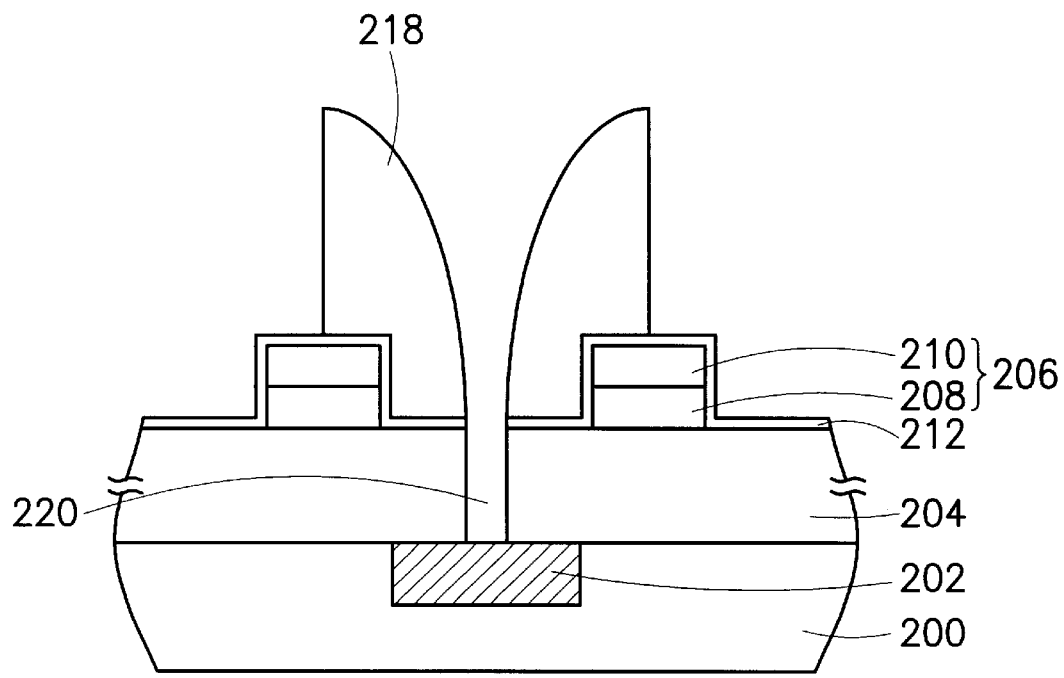

Referring to FIG. 2D, the liner layer 212, which is between the bit lines 206 and exposed by the spacer 218, is removed to expose the dielectric layer 204 by, for example, anisotropic etching. The exposed dielectric layer 204 and the dielectric layer 214 are removed simultaneously. A node contact 220 is formed in the dielectric layer 204 to expose the conductive layer 202. The etching rate of the dielectric layer 214 can be higher than that of the liner layer 212. For example, in the case that the material of the dielectric layer 214 is oxide, the liner layer 212 is silicon nitride layer. In this manner, while removing the dielectric layer 214, the liner layer 212 is used as an etching stop.

Figure 2E:
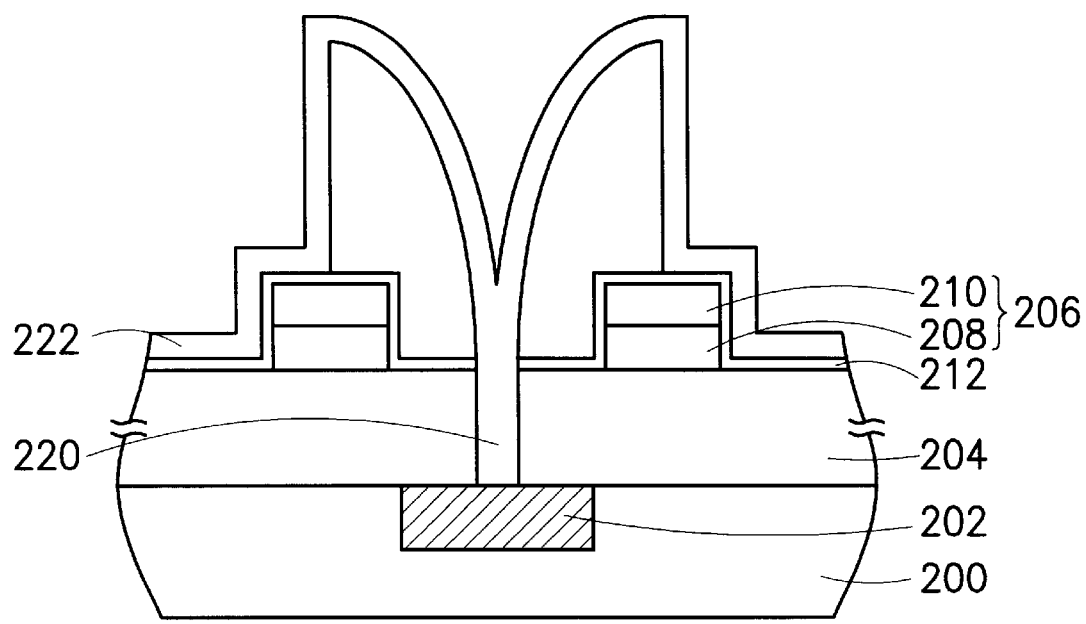

Referring to FIG. 2E, a conformal conductive layer 222, such as a polysilicon layer, is formed over the dielectric layer 204. The conformal conductive layer 222 preferably has a thickness of about 300 angstroms to 500 angstroms.

Figure 2F:
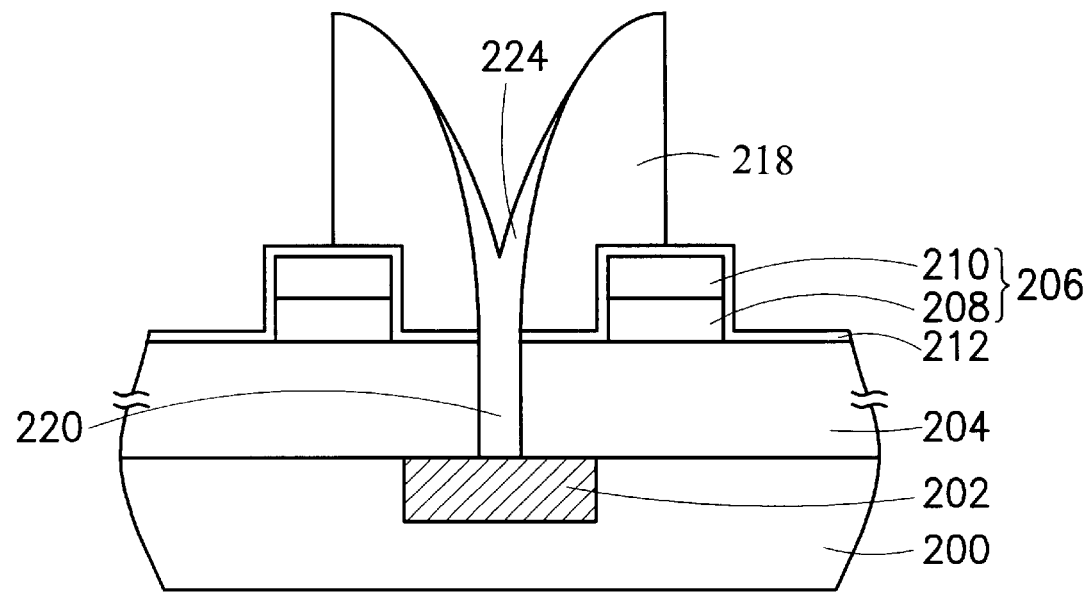

Referring to FIG. 2F, the conformal conductive layer 222 is etched back until the liner layer 212 is exposed. A conductive layer 224 is left in the node contact 220 to make contact with the conductive layer 202. The conformal conductive layer 222 preferably is etched back by, for example, anisotropic etching using the liner layer 212 as an etching stop. The conductive layer 224 and the conductive spacer 218 together form a bottom electrode. In order to further increase the surface area of the bottom electrode, a hemispherical-grained silicon (HSG) layer (not shown) can be formed on the conductive layer 224 and the conductive spacer 218.

The present invention increases the integration of the semiconductor circuit by forming the bottom electrode between the bit lines 206. Thus, the integration of the semiconductor devices is effectively increased. In addition, since the liner layer 212 is used to isolate the bit lines from the bottom electrode, the reliability of the devices is enhanced. Furthermore, in comparison with the box-shaped bottom electrode formed by the conventional method, the bottom electrode of the present invention has an increased surface area.

It will be apparent to those skilled in the art that various modifications and variations can be made to the structure and the method of the present invention without departing from the scope or spirit of the invention. In view of the foregoing, it is intended that the present invention cover modifications and variations of this invention provided they fall within the scope of the following claims and their equivalents.

What is claimed is:

1. A method of fabricating a bottom electrode, comprising:

provic a substrate having a first conductive layer therein;

forming a first dielectric layer over the substrate;

forming a plurality of bit lines over the first dielectric layer;

forming a conformal liner layer over the first dielectric layer to cover the plurality of bit lines;

forming a second dielectric layer over the conformal liner layer;

forming an opening in the second dielectric layer, wherein the opening exposes the conformal liner layer between the bit lines and on portions of the bit lines;

forming a conductive spacer on a sidewall of the opening, such that only a portion of the conformal liner layer between the bit lines is exposed by the spacer, while remaining at least the conformal liner layer lying on the whole bit lines;

removing the conformal liner layer which is not covered by the spacer and the second dielectric layer and is exposed by the spacer to expose the underlying first dielectric layer;

removing the first dielectric layer exposed by the conductive spacer to form a node contact opening in the first dielectric layer, wherein the node contact opening exposes the first conductive layer; and forming a second conductive layer in the node contact opening.

2. The method of claim 1, wherein each bit line includes a polysilicon layer and a tungsten silicide layer.

3. The method of claim 1, wherein the conformal liner layer is formed by plasma-enhanced chemical vapor deposition.

4. The method of claim 1, wherein the conformal liner layer is formed by deposition in a furnace.

5. The method of claim 1, wherein forming the conformal liner layer comprises forming a silicon nitride layer.

6. The method of claim 1, wherein the conformal liner layer has a thickness of about 100 angstroms to about 500 angstroms.

7. The method of claim 1, wherein the second dielectric layer has a thickness of about 8000 angstroms to 10000 angstroms.

8. The method of claim 1, wherein forming the second dielectric layer comprises forming an oxide layer.

9. The method of claim 1, wherein forming an opening in the second dielectric layer comprises performing a photolithographic and etching process using the conformal liner layer as an etching stop.

10. The method of claim 1, wherein forming a conductive spacer comprises forming a polysilicon spacer.

11. The method of claim 1, wherein removing the first dielectric layer exposed by the conductive spacer further comprises:

simultaneously removing the second dielectric layer using the conformal liner layer as an etching stop.

12. The method of claim 1, wherein forming the second conductive layer comprises forming a polysilicon layer.

13. The method of claim 1, wherein forming the second conductive layer further comprises:

forming a conformal conductive layer over the substrate to fill the node contact opening; and performing an etching step on the conformal conductive layer until the conformal liner layer is exposed.

14. The method of claim 13, wherein the thickness of the conformal conductive layer is about 300 angstroms to about 500 angstroms.

15. The method of claim 13, wherein the etching step is performed using the conformal liner layer as an etching stop.

16. The method of claim 13, wherein the etching step comprises anisotropic etching.

17. A method of fabricating a bottom electrode, comprising:

forming a first dielectric layer over a substrate;

forming a plurality of bit lines over the dielectric layer;

forming a conformal liner layer over the dielectric layer to cover the plurality of bit lines;

forming a second dielectric layer over the conformal liner layer; forming an opening in the second dielectric layer, wherein the opening exposes a portion of the conformal liner layer between the bit lines and on portions of the bit lines;

forming a conductive spacer on a sidewall of the opening, such that only a portion of the conformal liner layer between the bit lines is exposed by the spacer, while remaining at least the conformal liner layer lying on the whole bit lines; removing the conformal liner layer which is not covered by the spacer and the second dielectric layer and is exposed by the spacer to expose the underlying first dielectric layer;

removing the first dielectric layer exposed by the conductive spacer, while simultaneously removing the second dielectric layer, to form a node contact opening in the first dielectric layer, wherein the second dielectric layer is etched by using the liner layer as an etching stop;

forming a conformal conductive layer over the substrate; and patterning the conformal conductive layer to form a node contact in the node contact opening.

18. The method of claim 17, wherein the conformal liner layer is formed by deposition.

19. The method of claim 17, wherein forming the conformal liner layer comprises forming a silicon nitride layer.

20. The method of claim 17, wherein the conformal liner layer has a thickness of about 100 angstroms to about 500 angstroms.

* * * * *